US008803541B2

(12) United States Patent
Zudrell-Koch et al.

(10) Patent No.: US 8,803,541 B2
(45) Date of Patent: Aug. 12, 2014

(54) METHOD FOR THE OPERATION OF ILLUMINANTS

(75) Inventors: Stefan Zudrell-Koch, Hohenems (AT); Horst Knoedgen, Munich (DE)

(73) Assignee: TridonicAtco GmbH & Co. KG, Dornbirn (AT)

( * ) Notice: Subject to any disclaimer, the term of this patent is extended or adjusted under 35 U.S.C. 154(b) by 479 days.

(21) Appl. No.: 13/119,685

(22) PCT Filed: Sep. 25, 2009

(86) PCT No.: PCT/EP2009/006951
§ 371 (c)(1),
(2), (4) Date: Mar. 30, 2011

(87) PCT Pub. No.: WO2010/034509
PCT Pub. Date: Apr. 1, 2010

(65) Prior Publication Data
US 2011/0169494 A1 Jul. 14, 2011

(30) Foreign Application Priority Data
Sep. 25, 2008 (DE) .......................... 10 2008 048 899

(51) Int. Cl.
*G01R 31/26* (2014.01)
*H05B 33/08* (2006.01)
*G01R 31/28* (2006.01)

(52) U.S. Cl.
CPC .......... *H05B 33/0896* (2013.01); *H05B 33/089* (2013.01); *G01R 31/2837* (2013.01); *G01R 31/2635* (2013.01)
USPC ........... 324/760.01; 324/414; 345/76; 345/82

(58) Field of Classification Search
CPC ..................... G09G 2320/0295; G01R 31/2635
USPC ................... 324/760.01, 414, 762.01
See application file for complete search history.

(56) References Cited

U.S. PATENT DOCUMENTS 6,847,193 B2 * 1/2005 Sakuragi ........................ 320/166
6,975,214 B2 12/2005 Schleicher
(Continued)

FOREIGN PATENT DOCUMENTS

| DE | 20 2007 015857 U1 | 1/2008 |
| EP | 1 379 108 A1 | 1/2004 |
| EP | 1 973 385 A1 | 9/2008 |
| WO | WO-2008/120143 A2 | 10/2008 |

OTHER PUBLICATIONS

J. David Irwin and R. Mark Nelms, Basic Engineering Circuit Analysis, 2005, John Wiley & Sons, 8th ed.*
Cheung et al., "Modeling of a DH LED Using One-Port Impedance Measurements," *International Journal of Optoelectronics*, 12(3):91-97 (1998).
International Preliminary Report on Patentability for Application No. PCT/EP2009/006951, dated Mar. 29, 2011.
International Search Report and Written Opinion for Application No. PCT/EP2009/006951, dated Jun. 7, 2010.

*Primary Examiner* — Huy Q Phan
*Assistant Examiner* — Dustin Dickinson
(74) *Attorney, Agent, or Firm* — Marshall, Gerstein & Borun LLP

(57) ABSTRACT

The invention relates to the operation of illuminants, in particular OLEDs. The invention relates to a method and a measuring instrument for determining the electrical properties of an OLED, the equivalent circuit diagram of which is composed of the parallel connection of an equivalent diode $D_E$ and an equivalent capacitance $C_E$ as well as an equivalent resistance $R_E$ that is connected in series to said parallel connection. The values for the equivalent resistance $R_E$ and the equivalent capacitance $C_E$ are determined at a different time than are the values for the equivalent diode $D_E$.

22 Claims, 3 Drawing Sheets

(56) References Cited

U.S. PATENT DOCUMENTS

| | | |
|---|---|---|
| 2003/0071821 A1 | 4/2003 | Sundahl et al. |
| 2005/0083323 A1* | 4/2005 | Suzuki et al. ............... 345/207 |
| 2005/0162130 A1* | 7/2005 | Petitdidier ................ 320/116 |
| 2006/0132400 A1* | 6/2006 | Cok et al. .................. 345/81 |
| 2006/0274540 A1 | 12/2006 | Klaver et al. |
| 2007/0126018 A1* | 6/2007 | Kosowsky ................. 257/98 |
| 2008/0315788 A1* | 12/2008 | Levey et al. .............. 315/291 |
| 2009/0027314 A1* | 1/2009 | Kohno et al. .............. 345/76 |

* cited by examiner

METHOD FOR THE OPERATION OF ILLUMINANTS

BACKGROUND OF THE INVENTION

1. Field of the Invention

The present invention relates to the field of devices and methods for operating light-emitting means, more particularly OLEDs.

2. Related Technology

An organic light-emitting diode, abbreviated OLED, is a thin-film, luminous component made of organic semiconductor materials that differs from inorganic light-emitting diodes (LEDs) in that current density and luminance are reduced and there is no need for mono-crystalline materials. Since OLEDs can be printed onto almost any material, they offer significant savings over LCD technology. Bendable support materials (flexible substrates, films) can also be used for OLEDs, and this opens up entirely new possibilities. Driver circuits must be used to operate OLEDs. The electrical properties of the individual OLEDs, and also those of OLED combinations, must be known for designing the driver circuits. To this end, the producers generally provide datasheets with the relevant current/voltage characteristics of the OLEDs.

It has already been established to assume a parallel connection of an equivalent capacitor and an equivalent diode, and an equivalent resistor connected in series with this parallel connection, as an equivalent circuit diagram for an OLED.

SUMMARY OF THE INVENTION

The invention is based on the object of specifying options for being able to establish the elements in the equivalent circuit diagram.

Accordingly, in one embodiment of the invention, the values for the equivalent resistance $R_E$ and the equivalent capacitance $C_E$ are determined at a different time from when the values for the equivalent diode $D_E$ should be determined.

The relatively high equivalent resistance is of the order of 15Ω and is the result of very thin planar circuit-board conductors. As a result of the planar extent of the OLED, the equivalent capacitance is likewise relatively high and reaches values of between 200 and 400 pF/mm². The characteristic of the equivalent diode is that of a conventional diode, i.e. it only starts conducting above 2.5 V to 3 V.

An embodiment of the method according to the invention includes applying a known measurement current $I_M$, preferably a measurement current pulse, to the OLEDs for determining the equivalent resistance $R_E$, measuring the voltage drop $U_1$ across the OLED directly after the onset of the measurement current $I_M$, to be precise before a noteworthy charging voltage can be built up at the equivalent capacitor $C_E$, and then calculating the equivalent resistance $R_E$ according to the following formula:

$$R_E = U_1 / I_m. \quad (1)$$

A second development of the method according to the invention of includes applying a load-independent charging current $I_M$ to the OLED over a known charging period $\Delta t$ for determining the equivalent capacitance $C_E$, measuring the voltage drop $U_1$ across the OLED at the onset of the charging period and measuring the voltage drop $U_2$ at the end thereof, and calculating the equivalent capacitance $C_E$ according to the following formula:

$$C_E = I_M \cdot \Delta t / (U_2 - U_1), \quad (2)$$

where, if the charging current flows in the conducting direction of the equivalent diode $D_E$, the charging period $\Delta t$ has to be set so brief that the voltage drop $U_2$ at the end of the charging period still lies below the voltage at which the equivalent diode $D_E$ becomes conducting.

As an alternative to the last-described method step, the equivalent capacitance $C_E$ can also be determined by virtue of the fact that the OLED is connected to a known reference capacitor $C_R$ previously charged to a known reference voltage $U_R$, that the reduced balancing voltage $U_A$, reduced by the charge balancing, is then measured at the reference capacitor $C_R$ or the voltage then identical thereto is measured at the OLED, and that the equivalent capacitance $C_E$ is then calculated according to the following formula:

$$C_E = C_R \cdot U_R / U_A - 1, \quad (3)$$

where, if the reference voltage $U_R$ is directed in the conducting direction of the equivalent diode $D_E$, the reference voltage $U_R$ must be set such that the reduced balancing voltage $U_A$ emerging after the charge balancing is smaller than the voltage at which the equivalent diode $D_E$ becomes conducting.

According to a third embodiment of the method according to the invention, measuring the current/voltage characteristic of the OLED can determine the determination of the equivalent diode $D_E$ in a conventional fashion.

In order to have defined conditions for the measurements in all circumstances, it is furthermore proposed to apply a start voltage $U_S$, which is preferably 0, to the OLEDs before the onset of the measurements.

If a plurality of OLEDs are interconnected by parallel and/or series connections to form OLED combinations, the configuration of the OLED combinations can be discovered by using and evaluating the knee point in the current/voltage characteristic of the OLED combination as distinguishing criterion. The "knee point" should be understood to be the point at which the diode starts conducting.

The invention finally also relates to a measuring instrument for determining the electrical properties of an OLED, by means of which measuring instrument the method according to the invention can be conducted. The measuring instrument is characterized by means for producing a measurement current and/or charging current and by means for measuring the voltage drop across the OLED and/or the voltage across the reference capacitor $C_R$.

A development for the measuring instrument preferably includes providing it with a start-voltage source.

The invention also relates to an operating device for operating an OLED, which contains a measuring instrument for determining the electrical properties of an OLED, which measuring instrument can be used to conduct the method according to the invention. The operating device preferably contains a driver circuit, into which the measuring instrument for determining the electrical properties of an OLED is integrated, which measuring instrument can be used to conduct the method according to the invention. The operating device, preferably the driver circuit, can have the start-voltage source and/or means for producing a measurement current and/or charging current and/or means for measuring the voltage drop across the OLED and/or the voltage across the reference capacitor $C_R$.

The operating device can be part of a lighting unit that is suitable for operating OLEDs, wherein this lighting unit has a measuring instrument for determining the electrical properties of an OLED, by means of which the method according to the invention can be conducted.

The invention also relates to a method for determining the type of an OLED to be operated by an operating device, comprising the following steps:

measuring a characteristic value on the OLED, and determining the OLED type and/or the OLED dimension on the basis of the conducted measurement.

In this method, the OLED type and/or OLED dimension can be determined on the basis of the conducted measurement by comparing the conducted measurement with corresponding default values, which are stored in a table.

In particular, the characteristic values of the OLED, which can be used for determining the OLED type and/or OLED dimension, can be the values for the equivalent resistance $R_E$, the equivalent capacitance $C_E$ and/or the equivalent diode $D_E$. The values for the equivalent resistance $R_E$ and the equivalent capacitance $C_E$ can be determined at a different time from when the values for the equivalent diode $D_E$ are determined. The determined characteristic values for the OLED can be used to set the required operating parameters of the operating device for correctly operating the connected OLED on the basis of the undertaken determination of the OLED type and/or the OLED dimension.

BRIEF DESCRIPTION OF THE DRAWINGS

Exemplary embodiments of the invention are described below on the basis of the drawings.

In the drawings.

DETAILED DESCRIPTION

Figure 1:
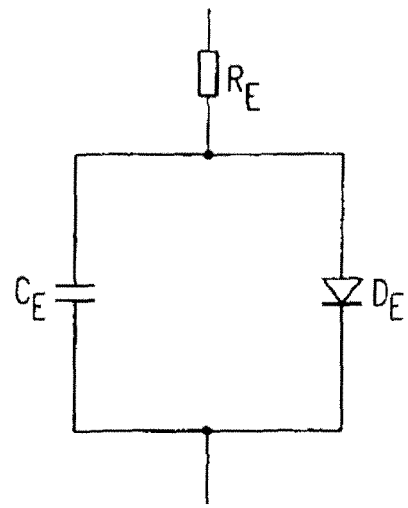
FIG. 1 shows the equivalent circuit diagram for an OLED.

The equivalent circuit diagram, shown in FIG. 1, for an OLED consists of a parallel connection of an equivalent capacitor $C_E$ and an equivalent diode $D_E$, with the parallel connection being connected in series with an equivalent resistor $R_E$.

Figure 2:
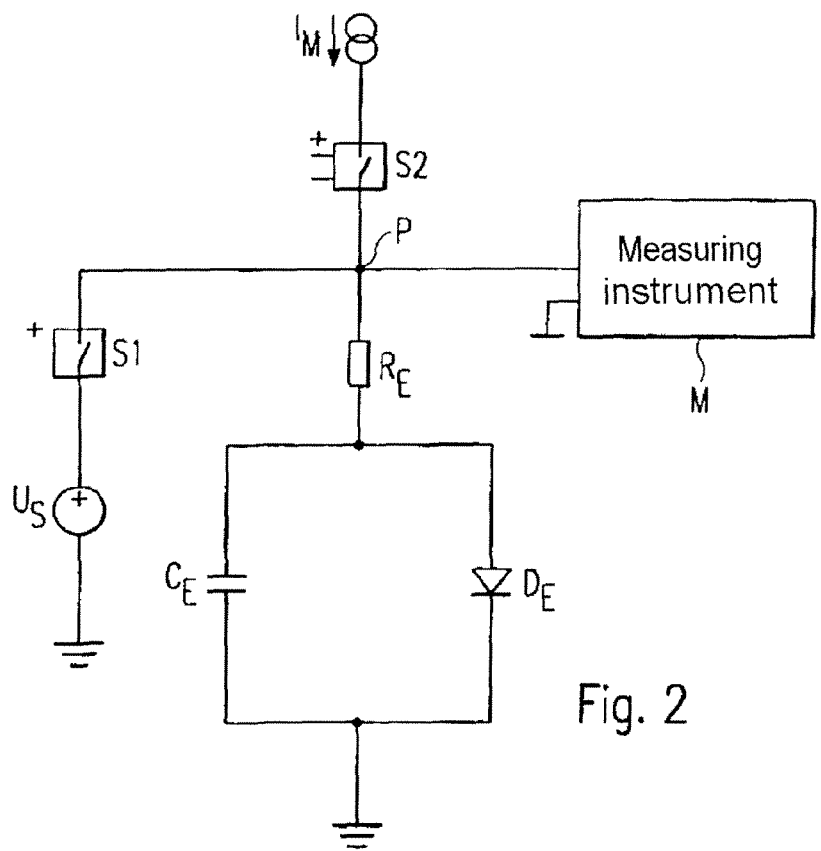
FIG. 2 shows a first measuring arrangement for determining the equivalent components of the equivalent circuit.

In FIG. 2, an OLED to be measured is again represented by the equivalent circuit diagram as per FIG. 1. One connector of the OLED is grounded and the other connector P is connected to a measuring instrument M. Accordingly, the connector P is the measurement point. A current source $I_M$ for a load-independent measurement current is also connected to the measurement point P via a switch S2. Furthermore, a start-voltage source $U_S$ is connected to the measurement point P via a switch S1. The start-voltage source $U_S$ has a voltage of 0 V in order to set the OLED to a defined potential.

Figure 3:
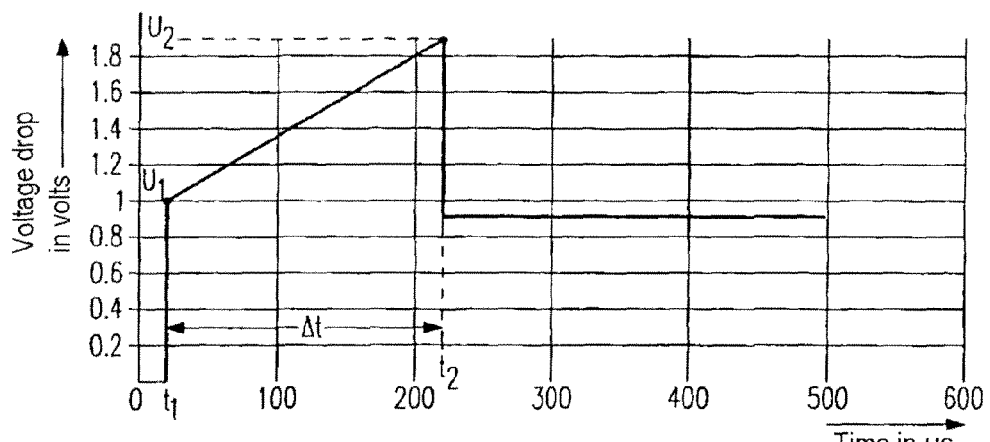
FIG. 3 shows the profile of the voltage drop across the OLED from FIG. 2 as a function of time, which profile is to be determined by the measuring instrument.

The time profile of the voltage measured by the measuring instrument M is illustrated in FIG. 3.

The switch S1 is closed at time 0, and so the OLED is set to the defined voltage of 0 V and the equivalent capacitor $C_E$ does not have any charge either.

The switch S1 is opened at time $t_1$ and the switch S2 is closed. As a result, the load-independent measurement current $I_M$ flows into the OLED. Initially, it is only the voltage drop across the equivalent resistor $R_E$ that is decisive for the voltage at the measurement point P because the equivalent capacitor $C_E$ is initially still without voltage and only charges over time. The voltage drop $U_1$ at the measurement point P is 1 V at the time $t_1$ in the illustrated example (see FIG. 3). At this voltage, the equivalent diode $D_E$ still is in the non-conducting region, and so the equivalent resistance $R_E$ at time $t_1$ can easily be calculated by the formula:

$$R_E = U_1/I_M. \quad (4)$$

$I_M$ and $U_1$ are known.

Between the time $t_1$ and time $t_2$, the voltage at the measurement point P now rises linearly to the voltage $U_2$, which is 1.9 V in the present example. The equivalent diode $D_E$ is still in the non-conducting region at this voltage too. The linear increase in the voltage is the result of charging the equivalent capacitor $C_E$ and the fact that $I_M$ is a load-independent current.

The switch S2 is reopened at time $t_2$, resulting in the charging of the equivalent capacitor $C_E$ being interrupted and no more charging current flowing through the equivalent resistor $R_E$. The voltage at the measurement point P falls accordingly again.

During the measurement procedure, the measuring instrument M records the voltage drops $U_1$ and $U_2$ at the measurement point P and the charging period $\Delta t$ as the difference between the times $t_2$ and $t_1$. Furthermore, the load-independent measurement current $I_M$ is known.

The load-independent measurement current $I_M$ conveys charges Q to the equivalent capacitor $C_E$. At time $t_1$, the following holds true for the voltage at the equivalent capacitor $C_E$:

$$U_{C1} = Q_1/C_E. \quad (5)$$

At time $t_2$, the following holds true for the voltage at the equivalent capacitor $C_E$:

$$U_{C2} = Q_2/C_E. \quad (6)$$

Moreover, $$I_M = \Delta Q/\Delta t \quad (7)$$

and $$\Delta Q = Q_2 - Q_1 = C_E \cdot (U_{C2} - U_{C1}) \quad (8)$$

hold true. Moreover, the following holds true for the voltage at the equivalent capacitor $C_E$ at times $t_1$ and $t_2$:

$$U_{C2} = U_2 - I_M \cdot R_E \quad (9)$$

and $$U_{C1} = U_1 - I_M \cdot R_E. \quad (10)$$

Subtracting (10) from (9) yields $$U_{C2} - U_{C1} = U_2 - U_1 \quad (11)$$

and combining formulae (9) and (11) yields $$\Delta Q = C_E \cdot (U_2 - U_1). \quad (12)$$

The combination of formulae (7) and (12) yields $$I_M \cdot \Delta t = C_E \cdot (U_2 - U_1). \quad (13)$$

This leads to the formula by means of which the equivalent capacitance can be calculated, namely $$C_E = I_M \cdot \Delta t/(U_2 - U_1). \quad (14)=(2)$$

In the above-described example, the load-independent measurement current $I_M$ flows in the conducting direction of the equivalent diode $D_E$. Hence, care has to be taken that the highest charging voltage of the equivalent capacitor $C_E$, applied to the equivalent diode $D_E$, lies below the voltage at which the charging diode $D_E$ starts to conduct. This certainly holds true if, as shown in FIG. 3, the voltage $U_2$ at the measurement point P at time $t_2$ is 1.9 V. The voltage at the equivalent diode $D_E$ then has been reduced by the voltage drop at the equivalent resistor $D_E$ and therefore is in the safe region. It goes without saying that the aforementioned deliberations also hold true for the start voltage $U_S$.

Figure 4:
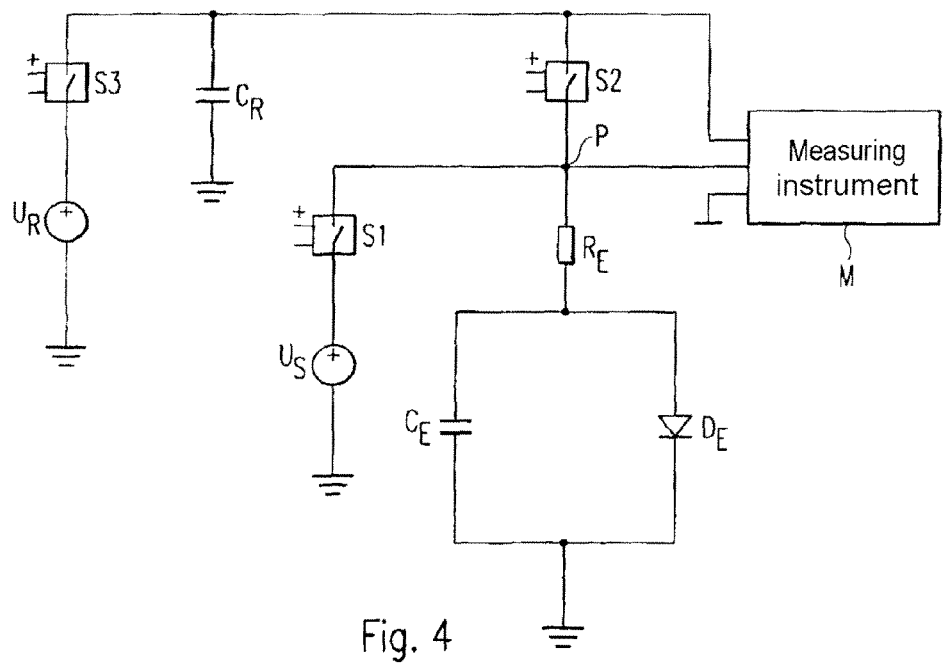
FIG. 4 shows an alternative measuring arrangement to the one in FIG. 2, which is particularly suitable for determining the equivalent capacitance.

FIG. 4 shows a measurement arrangement that provides a different way of measuring the equivalent capacitance $C_E$ than is provided by the measurement arrangement shown in FIG. 2.

A reference capacitor $C_R$ is provided in FIG. 4 in place of a current source, which reference capacitor can, via switch S3, be charged to a reference voltage $U_R$ by means of a voltage source.

After the reference capacitor $C_R$ has been charged, the switch S3 is opened and the switch S2 is closed. As a result, there is charge balancing between the reference capacitor $C_R$ and the equivalent capacitor $C_E$ of the OLED. The measuring instrument M first of all measures the charging voltage $U_R$ at the reference capacitor $C_R$. After the charge balancing, the switch S2 is reopened and the measuring instrument M is used to measure the voltage drop at the measurement point P or the now-reduced balancing voltage $U_A$ at the reference capacitor $C_R$ (the switch S3 is opened in the process). As a result of charge balancing, the voltages at firstly the reference capacitor $C_R$ and secondly the measurement point P have to be equal, even after the switch S2 has been opened; to be precise, they have to equal the balancing voltage $U_A$.

Initially, the following holds true for the reference capacitor $C_R$ charged to the reference voltage $U_R$:

$$U_R = Q_R/C_R. \quad (15)$$

After the charge balancing, the balancing voltage $U_A$ sets in, which emerges from the following formula:

$$U_A = Q_R(C_R + C_E). \quad (16)$$

Combining formulae (15) and (16) yields the formula that likewise can be used to calculate the equivalent capacitance $C_E$, namely:

$$C_E = C_R \cdot U_R/U_A - 1, \quad (17) = (3)$$

Figure 5:
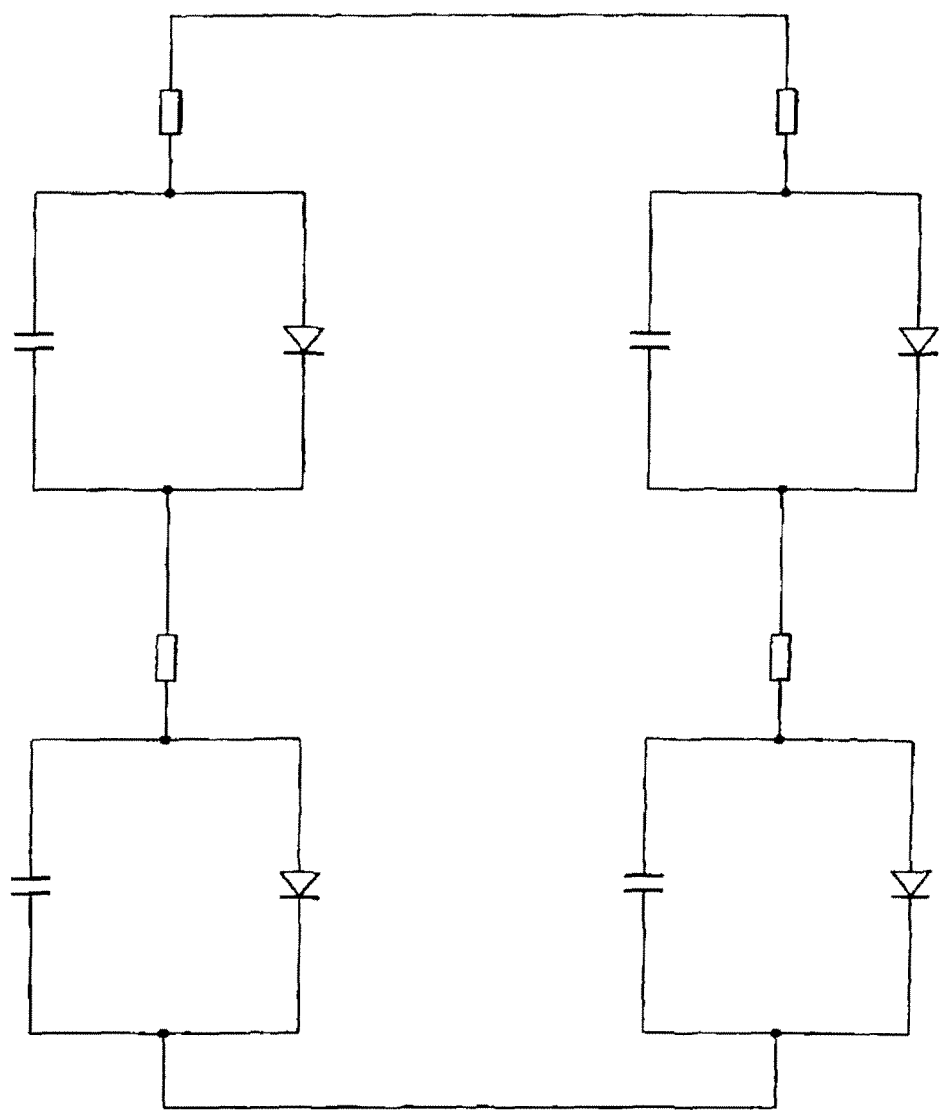
FIG. 5 shows a combination of four OLEDs, two of which are in each case connected in series and the two series connections are connected in parallel.

The equivalent diode $D_E$ is determined in a conventional fashion by measuring the current/voltage characteristic of the OLED. This characteristic is nonlinear. This property affords the possibility of using and evaluating the current/voltage characteristic to be able to distinguish between the individual OLED combinations. A possible OLED combination is shown in FIG. 5. It consists of four OLEDs, two of which are in each case connected in series and two of these series connections are combined to form a parallel connection. Other OLED combinations are also possible. These then differ by a different position of the knee point in the current/voltage characteristic, which can thus be used to distinguish between them.

The measuring instrument M for determining the electrical properties of an OLED, by means of which measuring instrument the method according to the invention can be conducted, can be contained in an operating device for operating an OLED. The operating device preferably contains a driver circuit, which can operate the connected OLED in accordance with the determined properties after the electrical properties of an OLED have been determined.

The driver circuit of the operating device can have an integrated control circuit, which can control or else regulate the driver circuit. By way of example, the integrated control circuit can be a microcontroller or an ASIC.

The operating device can comprise at least one interface. The interface can be connected to the integrated control circuit. The interface can be used to transmit control commands for the corresponding operation of the OLED to the operating device, such as e.g. switch-on and switch-off commands, changes in brightness, parameters relating to the color to be set or else status information, which can initiate a specific operating mode. The operating device can use the interface to transmit information relating to the results of determining the electrical properties of an OLED. Control devices can use the transmitted information to adapt their control commands in accordance with this information. Thus, for example, the determination of the OLED type or OLED dimension can adapt the required brightness commands and/or color commands in order to adapt available brightnesses and/or colors of the connected OLED to the user requirements.

The operating device can contain a switched-mode regulator as a driver circuit, for example an AC/DC converter or a DC/DC converter. The operating device can contain a PFC (active or passive power factor correction circuit). By way of example, the PFC can be formed by a boost converter, a buck-boost converter, a flyback converter or else by a "valley fill circuit" (pump circuit).

The operating device can have an isolator. This isolation can for example be brought about by a transformer.

By way of example, the operating device can contain a flyback converter, a forward converter or a half-bridge converter with transformer.

If the operating device has a PFC, it can be embodied in a so-called single-stage topology, for example by means of a flyback converter that operates in the so-called borderline operating mode (operating in the border region between continuous and discontinuous current) and thus assumes both the PFC function and the OLED operation, or else in a so-called two-stage topology, for example by means of a boost converter as a PFC with a downstream half-bridge converter or full-bridge converter for OLED operation.

The operating device can have means for regulating the current through the OLED, for regulating the voltage across the OLED or else for regulating the power supplied to the OLED. The OLED to be operated may for example also be an OLED combination as illustrated in FIG. 5.

The operating device can have a storage medium, which stores the electrical properties of the OLED that were determined by the method according to the invention. Additionally, or as an alternative thereto, the operating parameters for the operating device required for the operation of the OLED can be set to correctly operate the connected OLED on the basis of the conducted determination of the OLED type and/or the OLED dimension. The OLED type and/or the OLED dimension, which was determined on the basis of the measurement, can also be stored in the storage medium. By way of example, the OLED type and/or the OLED dimension can be determined by comparing the conducted measurement with corresponding parameter values, which are stored in a table, for example in the storage medium. The storage medium can be contained in the integrated control circuit or it can be connected to the integrated control circuit as its own integrated circuit. By way of example, the store medium can be a flash memory.

The measuring instrument M for determining the electrical properties of an OLED, by means of which the method according to the invention can be conducted, can preferably be integrated into the driver circuit, which is a component of the operating device. The operating device, preferably the driver circuit, can have the start-voltage source $U_S$ and/or means for producing a measurement current and/or charging current and/or means for measuring the voltage drop across the OLED and/or the voltage across the reference capacitor $C_R$. The driver circuit can also contain a switch S1, a switch S2 and/or a voltage source for producing a reference voltage $U_R$, and also a switch S3. By applying the method according to the invention, the operating device can determine the electrical properties for e.g. an OLED combination as shown in FIG. 5 and hence also establish the OLED type and/or OLED dimensions of such an OLED combination and thereupon operate the latter correctly.

The operating device can be part of a lighting unit that is suitable for operating OLEDs, wherein this lighting unit has a measuring instrument for determining the electrical properties of an OLED, by means of which measuring instrument the method according to the invention can be conducted.

Hence, this allows a method for determining the type of an OLED to be operated by an operating device, comprising the following steps:
measuring a characteristic value on the OLED, and
determining the OLED type and/or the OLED dimension on the basis of the conducted measurement.

In this method, the OLED type and/or OLED dimension can be determined on the basis of the conducted measurement by comparing the conducted measurement with corresponding default values, which are stored in a table.

In particular, the characteristic values of the OLED, which can be used for determining the OLED type and/or OLED dimension, can be the values for the equivalent resistance $R_E$, the equivalent capacitance $C_E$ and/or the equivalent diode $D_E$. The values for the equivalent resistance $R_E$ and the equivalent capacitance $C_E$ can be determined at a different time from when the values for the equivalent diode $D_E$ are determined. The determined characteristic values for the OLED can be used to set the required operating parameters of the operating device for correctly operating the connected OLED on the basis of the undertaken determination of the OLED type and/or the OLED dimension. The values for the equivalent resistance $R_E$ and the equivalent capacitance $C_E$ can be determined at a different time from when the values for the equivalent diode $D_E$ are determined by using the measuring arrangements described with reference to FIG. 2 and/or FIG. 4.

The invention claimed is:

1. A method for determining the electrical properties of an OLED, the equivalent circuit diagram of which includes a parallel connection of an equivalent diode $D_E$ and an equivalent capacitor $C_E$, and an equivalent resistor $R_E$ connected in series with this parallel connection, comprising:
measuring a value for the equivalent resistance $R_E$ based on the equivalent circuit diagram;
measuring a value for the equivalent capacitance $C_E$ based on the equivalent circuit diagram at least partially concurrently with measuring the value for the equivalent resistance $R_E$; and
measuring, separately from the time of measuring the values of the equivalent resistance $R_E$ and the equivalent capacitance $C_E$, values for the equivalent diode $D_E$ based on the equivalent circuit diagram;
wherein the values of the equivalent resistance $R_E$ and the equivalent capacitance $C_E$ are measured while limiting the voltage drop across the OLED to levels below the voltage at which the equivalent diode $D_E$ becomes conducting.

2. The method as claimed in claim 1, wherein
a known measurement current $I_M$ is applied to the OLED for determining the equivalent resistance $R_E$,
the voltage drop $U_1$ across the OLED is measured directly after the onset of the measurement current $I_M$ before a noteworthy charging voltage can be built up at the equivalent capacitor $C_E$, and
the equivalent resistance $R_E$ is then calculated according to the following formula:

$$R_E = U_1/I_M, \qquad (1).$$

3. The method as claimed in claim 1, wherein a load-independent charging current $I_M$ is applied to the OLED over a known charging period $\Delta t$ for determining the equivalent capacitance $C_E$,
the voltage drop $U_1$ across the OLED is measured at the onset of the charging period and the voltage drop $U_2$ is measured at the end of the charging period, and
the equivalent capacitance $C_E$ is calculated according to the following formula:

$$C_E = I_M \cdot \Delta t/(U_2 - U_1), \qquad (2)$$

where, if the charging current flows in the conducting direction of the equivalent diode $D_E$, the charging period $\Delta t$ is set so brief that the voltage drop $U_2$ at the end of the charging period still lies below the voltage at which the equivalent diode $D_E$ becomes conducting.

4. The method as claimed in claim 1, wherein the OLED is connected to a known reference capacitor $C_R$, previously charged to a known reference voltage $U_R$, for determining the equivalent capacitance $C_E$,
the reduced balancing voltage $U_A$, reduced by the charge balancing, is then measured at the reference capacitor $C_R$ or the voltage then identical thereto is measured at the OLED, and
the equivalent capacitance $C_E$ is then calculated according to the following formula:

$$CE = CR \cdot UR/UA - 1, \qquad (3)$$

where, if the reference voltage $U_R$ is directed in the conducting direction of the equivalent diode $D_E$, the reference voltage $U_R$ is set such that the reduced balancing voltage $U_A$ emerging after the charge balancing is smaller than the voltage at which the equivalent diode $D_E$ becomes conducting.

5. The method as claimed in claim 1, wherein the current/voltage characteristic of the OLED is measured for determining the equivalent diode $D_E$.

6. The method as claimed in claim 1, wherein a start voltage $U_S$ is applied to the OLED before the onset of the measurements.

7. The method as claimed in claim 1, further comprising determining a configuration of an OLED combination including a plurality of OLEDs, comprising using and evaluating a knee point in a current/voltage characteristic of the OLED combination as a distinguishing criterion.

8. A measuring instrument for determining the electrical properties of an OLED, for conducting the method as claimed in claim 1, comprising means for producing a measurement current and/or charging current and means for measuring the voltage drop across the OLED and/or the voltage across the reference capacitor $C_R$.

9. The measuring instrument as claimed in claim 8, further comprising a start-voltage source $U_S$.

10. An operating device for an OLED, having a measuring instrument for determining the electrical properties of an OLED, for conducting the method as claimed in claim 1.

11. The operating device as claimed in claim 10, comprising a start-voltage source $U_S$.

12. A method for determining the type of an OLED to be operated by an operating device, comprising:

measuring a plurality of characteristic values of the OLED, wherein the characteristic values correspond to the elements in the equivalent circuit diagram of the OLED, which comprises a parallel connection of an equivalent diode $D_E$ and an equivalent capacitor $C_E$ and an equivalent resistor $R_E$ connected in series with this parallel connection; and determining the OLED type and/or the OLED dimension on the basis of the measured characteristic values;

wherein the values of the equivalent resistance $R_E$ and the equivalent capacitance $C_E$ are measured based on the equivalent circuit diagram and at least partially concurrently, wherein the values of the equivalent diode $D_E$ are measured based on the equivalent circuit diagram and separately from the time of measuring the values of the values for the equivalent resistance $R_E$ and the equivalent capacitance $C_E$ and wherein the voltage drop across the equivalent diode $D_E$ remains below the voltage at which the equivalent diode $D_E$ becomes conducting while measuring the characteristic value corresponding to the equivalent capacitor $C_r$ or corresponding to the equivalent resistor $R_E$.

13. The method as claimed in claim 12, comprising determining the OLED type and/or OLED dimension on the basis of the conducted measurement by comparing the conducted measurement with corresponding default values, which are stored in a table.

14. The method as claimed in claim 12, comprising determining the values for the equivalent resistance $R_E$ and the equivalent capacitance $C_E$ at a different time from when the values for the equivalent diode $D_E$ are determined.

15. The method as claimed in claim 2, wherein the known measurement current $I_M$ is a measurement current pulse.

16. The method as claimed in claim 2, wherein a load-independent charging current $I_M$ is applied to the OLED over a known charging period $\Delta t$ for determining the equivalent capacitance $C_E$, the voltage drop $U_1$ across the OLED is measured at the onset of the charging period and the voltage drop $U_2$ is measured at the end of the charging period, and the equivalent capacitance $C_E$ is calculated according to the following formula:

$$C_E = I_M \cdot \Delta t / (U_2 - U_1), \quad (2)$$

where, if the charging current flows in the conducting direction of the equivalent diode $D_E$, the charging period $\Delta t$ is set so brief that the voltage drop $U_2$ at the end of the charging period still lies below the voltage at which the equivalent diode $D_E$ becomes conducting.

17. The method as claimed in claim 2, wherein the OLED is connected to a known reference capacitor $C_R$, previously charged to a known reference voltage $U_R$, for determining the equivalent capacitance $C_E$, the reduced balancing voltage $U_A$, reduced by the charge balancing, is then measured at the reference capacitor $C_R$ or the voltage then identical thereto is measured at the OLED, and the equivalent capacitance $C_E$ is then calculated according to the following formula:

$$CE = CR \cdot UR/UA - 1, \quad (3)$$

where, if the reference voltage $U_R$ is directed in the conducting direction of the equivalent diode $D_E$, the reference voltage $U_R$ is set such that the reduced balancing voltage $U_A$ emerging after the charge balancing is smaller than the voltage at which the equivalent diode $D_E$ becomes conducting.

18. The method as claimed in claim 6, wherein the start voltage $U_S$ is zero.

19. A measuring instrument for determining the electrical properties of an OLED, for conducting the method as claimed in claim 7, comprising means for producing a measurement current and/or charging current and means for measuring the voltage drop across the OLED and/or the voltage across the reference capacitor $C_R$.

20. The measuring instrument as claimed in claim 19, further comprising a start-voltage source $U_S$.

21. An operating device for an OLED, having a measuring instrument for determining the electrical properties of an OLED, for conducting the method as claimed in claim 7.

22. The operating device as claimed in claim 21, comprising a start-voltage source $U_S$.

* * * * *